United States Patent
Yamada et al.

(10) Patent No.: US 9,546,435 B2
(45) Date of Patent: Jan. 17, 2017

(54) VAPOR PHASE GROWTH APPARATUS AND VAPOR PHASE GROWTH METHOD

(71) Applicant: NuFlare Technology, Inc., Yokohama (JP)

(72) Inventors: Takumi Yamada, Kanagawa (JP); Yuusuke Sato, Tokyo (JP)

(73) Assignee: NuFlare Technology, Inc., Yokohama (JP)

( * ) Notice: Subject to any disclaimer, the term of this patent is extended or adjusted under 35 U.S.C. 154(b) by 399 days.

(21) Appl. No.: 14/322,127

(22) Filed: Jul. 2, 2014

(65) Prior Publication Data

US 2015/0007766 A1 Jan. 8, 2015

(30) Foreign Application Priority Data

Jul. 8, 2013 (JP) .................................. 2013-142616

(51) Int. Cl.
*C30B 25/16* (2006.01)
*C30B 35/00* (2006.01)
*C30B 29/40* (2006.01)

(52) U.S. Cl.
CPC ........... *C30B 25/165* (2013.01); *C30B 29/403* (2013.01); *C30B 35/00* (2013.01)

(58) Field of Classification Search
CPC combination set(s) only.
See application file for complete search history.

(56) References Cited

FOREIGN PATENT DOCUMENTS

JP 2002-313731 10/2002

*Primary Examiner* — Duy Deo
*Assistant Examiner* — Erin Bergner
(74) *Attorney, Agent, or Firm* — Oblon, McClelland, Maier & Neustadt, L.L.P.

(57) ABSTRACT

A vapor phase growth apparatus of an embodiment includes: a reaction chamber; a gas supply path connected to an organic metal supply source at a first connection, the gas supply path being connected to a carrier gas supply source, the gas supply path supplies a process gas including organic metal and a carrier gas into the reaction chamber; a gas discharge path connected to the organic metal supply source at a second connection, the gas discharge path discharges the process gas to the outside of the apparatus; a first mass flow controller and a first adjustment device provided at the gas supply path; a second adjustment device provided at the gas discharge path; and a shortcut path connecting the gas supply path to the gas discharge path. One of the first and the second adjustment device is a back pressure regulator, and the other is a mass flow controller.

11 Claims, 4 Drawing Sheets

VAPOR PHASE GROWTH APPARATUS AND VAPOR PHASE GROWTH METHOD

CROSS-REFERENCE TO RELATED APPLICATION

This application is based upon and claims the benefit of priority from Japanese Patent Application No. 2013-142616, filed on Jul. 8, 2013, the entire contents of which are incorporated herein by reference.

FIELD OF THE INVENTION

Embodiments described herein relate generally to a vapor phase growth apparatus and a vapor phase growth method of forming a film by supplying a gas thereto.

BACKGROUND OF THE INVENTION

As a method of forming a high-quality semiconductor film, there is known an epitaxial growth technique of growing a single-crystal film on a substrate such as a wafer by the vapor phase growth. In a vapor phase growth apparatus that uses the epitaxial growth technique, a wafer is placed on a support portion inside a reaction chamber that is maintained in a normal pressure state or a reduced pressure state. Then, a process gas such as a source gas used as a raw material for forming a film is supplied from, for example, a shower plate (or a shower head) at the upper portion of the reaction chamber to a wafer surface while the wafer is heated. Thus, a thermal reaction of the source gas occurs on the surface of the wafer, and hence an epitaxial single-crystal film is formed on the surface of the wafer.

In recent years, a semiconductor device using GaN (gallium nitride) has been gaining attention as a material of a light emitting device or a power device. As the epitaxial growth technique that forms a GaN-based semiconductor, a metal organic chemical vapor deposition (MOCVD) is known. In the metal organic chemical vapor deposition, for example, organic metal such as trimethylgallium (TMG), trimethylindium (TMI), and trimethylaluminum (TMA) or ammonia ($NH_3$) is used as the source gas.

In the MOCVD, in order to form a uniform film on the wafer surface, the amount of the organic metal in the source gas needs to be stabilized. JP-A 2002-313731 discloses a configuration in which the pressure inside a source gas supply path is maintained in a constant range and a uniform film is formed on a wafer surface.

SUMMARY OF THE INVENTION

According to an embodiment, there is provided a vapor phase growth apparatus including: a reaction chamber; a gas supply path connected to an organic metal supply source supplying organic metal at a first connection, the gas supply path being connected to a carrier gas supply source supplying a carrier gas, the gas supply path configured to supply a process gas including the organic metal and the carrier gas to the reaction chamber; a gas discharge path connected to the organic metal supply source at a second connection, the gas discharge path configured to discharge the process gas including the organic metal and the carrier gas to an outside of the apparatus; a first mass flow controller provided at the gas supply path, the first mass flow controller being provided at the side of the carrier gas supply source in relation to the first connection; a first adjustment device provided at the gas supply path, the first adjustment device being provided at a side of the reaction chamber in relation to the first connection; a second adjustment device provided at the gas discharge path, the second adjustment device being provided at an outside of the apparatus in relation to the second connection; and a shortcut path connecting the gas supply path and the gas discharge path, one end of the shortcut path being connected to the gas supply path between the first mass flow controller and the first adjustment device, other end of the shortcut path being connected to the gas discharge path opposite to an outside of the apparatus in relation to the second adjustment device, at least one of the first adjustment device and the second adjustment device is a back pressure regulator, and the other thereof is a mass flow controller.

According to another embodiment, there is provided a vapor phase growth method performed by using a vapor phase growth apparatus including: a reaction chamber; a gas supply path connected to an organic metal supply source supplying organic metal at a first connection, the gas supply path being connected to a carrier gas supply source supplying a carrier gas, the gas supply path configured to supply a process gas including the organic metal and the carrier gas to the reaction chamber; a gas discharge path connected to the organic metal supply source at a second connection, the gas discharge path configured to discharge the process gas including the organic metal and the carrier gas to an outside of the apparatus; a first mass flow controller provided at the gas supply path, the first mass flow controller being provided at the side of the carrier gas supply source in relation to the first connection; a first adjustment device provided at the gas supply path, the first adjustment device being provided at a side of the reaction chamber in relation to the first connection; a second adjustment device provided at the gas discharge path, the second adjustment device being provided at an outside of the apparatus in relation to the second connection; and a shortcut path connecting the gas supply path and the gas discharge path, one end of the shortcut path being connected to the gas supply path between the first mass flow controller and the first adjustment device, other end of the shortcut path being connected to the gas discharge path opposite to an outside of the apparatus in relation to the second adjustment device, at least one of the first adjustment device and the second adjustment device is a back pressure regulator, and the other thereof is a mass flow controller, the vapor phase growth method comprising: carrying in a substrate into the reaction chamber; causing the carrier gas to flow into the gas supply path and the gas discharge path; causing the organic metal to flow into the gas discharge path while the flow of the organic metal into the gas supply path is interrupted; causing the gas supply path to connect with the gas discharge path by the shortcut path so that the pressure inside the gas supply path becomes substantially equal to the pressure inside the gas discharge path; controlling the pressure at a desired pressure by the back pressure regulator; interrupting the flow of the organic metal into the gas discharge path; causing the organic metal to flow into the gas supply path; and supplying the organic metal and the carrier gas to the reaction chamber while the pressure is maintained at the desired pressure so as to form a semiconductor film on a substrate surface.

DETAILED DESCRIPTION OF THE EMBODIMENTS

Figure 1:
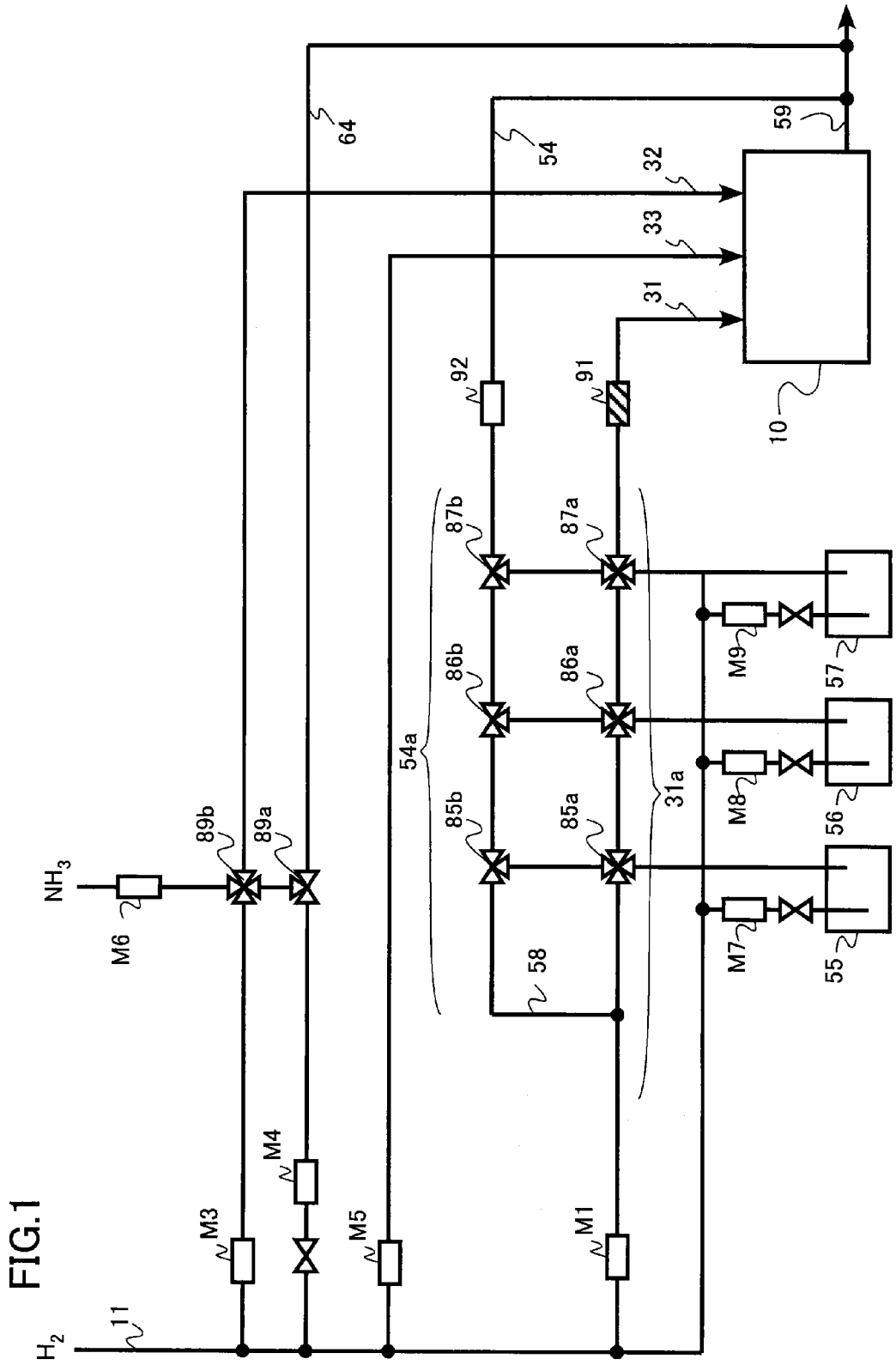
FIG. 1 is a configuration diagram of a vapor phase growth apparatus of a first embodiment.

Hereinafter, embodiments will be described with reference to the drawings.

Furthermore, in the specification, the gravity direction in the state where a vapor phase growth apparatus is provided so as to form a film is defined as the "down", and the opposite direction is defined as the "up". Accordingly, the "lower portion" indicates the position of the gravity direction with respect to the reference, and the "downside" indicates the gravity direction with respect to the reference. Then, the "upper portion" indicates the position in the direction opposite to the gravity direction with respect to the reference, and the "upside" indicates the direction opposite to the gravity direction with respect to the reference. Further, the "longitudinal direction" indicates the gravity direction.

Further, in the specification, the "process gas" generally indicates a gas used to form a film on the substrate, and corresponds to, for example, a concept including a source gas, a carrier gas, a separation gas, a compensation gas, and the like.

Further, in the specification, the "compensation gas" indicates a process gas that is supplied to the reaction chamber along with the source gas by the same supply path before the source gas is supplied to the reaction chamber and does not include the source gas. When the compensation gas is changed to the source gas directly before the film formation process, a change in environment such as a pressure change and a temperature change inside the reaction chamber is suppressed as much as possible, and hence the film formation process is stably performed on the substrate.

Further, in the specification, the "separation gas" indicates a process gas which is introduced into the reaction chamber of the vapor phase growth apparatus, and generally indicates a gas which separates the process gases of multiple raw material gases.

First Embodiment

A vapor phase growth apparatus of the embodiment includes: a reaction chamber; a gas supply path connected to an organic metal supply source supplying organic metal at a first connection, the gas supply path being connected to a carrier gas supply source supplying a carrier gas, the gas supply path configured to supply a process gas including the organic metal and the carrier gas to the reaction chamber; a gas discharge path connected to the organic metal supply source at a second connection, the gas discharge path configured to discharge the process gas including the organic metal and the carrier gas to an outside of the apparatus; a first mass flow controller provided at the gas supply path, the first mass flow controller being provided at the side of the carrier gas supply source in relation to the first connection; a first adjustment device provided at the gas supply path, the first adjustment device being provided at a side of the reaction chamber in relation to the first connection; a second adjustment device provided at the gas discharge path, the second adjustment device being provided at an outside of the apparatus in relation to the second connection; and a shortcut path connecting the gas supply path and the gas discharge path, one end of the shortcut path being connected to the gas supply path between the first mass flow controller and the first adjustment device, other end of the shortcut path being connected to the gas discharge path opposite to an outside of the apparatus in relation to the second adjustment device. Then, any one of the first adjustment device and the second adjustment device is the back pressure regulator, and the other thereof is the mass flow controller.

Since the vapor phase growth apparatus of the embodiment has the above-described configuration, the pressure between the gas discharge path and the gas supply path through which the organic metal flows may be maintained at a desired value, that is, the same pressure by a simple configuration. Accordingly, the amount of the organic metal in the process gas (the source gas) including the organic metal supplied from the gas supply path to the reaction chamber is stabilized during the film formation process. Accordingly, a process of forming a film having stabilized film quality may be realized.

FIG. 1 is a configuration diagram of the vapor phase growth apparatus of the embodiment. The vapor phase growth apparatus of the embodiment is a vertical single wafer type epitaxial growth apparatus that uses MOCVD (metal organic chemical vapor deposition). Hereinafter, a case will be mainly described in which the epitaxial growth of GaN (gallium nitride) is performed.

The vapor phase growth apparatus includes the reaction chamber 10 in which a film is formed on a substrate such as a wafer. Then, the first gas supply path 31, the second gas supply path 32, and the third gas supply path 33 are provided which supply the process gases to the reaction chamber.

The first gas supply path 31 supplies the first process gas including the carrier gas and the organic metal of the group-III element to the reaction chamber. The first process gas is a gas including a group-III element when the films of semiconductors of groups III to V are formed on the wafer.

The group-III element is, for example, gallium (Ga), Al (aluminum), In (indium), or the like. Further, the organic metal is trimethylgallium (TMG), trimethylaluminum (TMA), trimethylindium (TMI), or the like.

Further, the first, second, and third organic metal storage containers 55, 56, and 57 storing the organic metal are provided. The first, second, and third organic metal storage containers 55, 56, and 57 are examples of the organic metal supply source. The first organic metal storage container 55 stores, for example, TMG, the second organic metal storage container 56 stores, for example, TMA, and the third organic metal storage container 57 stores, for example, TMI.

Further, the first, second, and third organic metal storage containers 55, 56, and 57 are connected to the carrier gas supply source 11 into which the carrier gas used to bubble the organic metal is introduced. The carrier gas supply source 11 is, for example, a hydrogen gas line which supplies the hydrogen gas. Further, the mass flow controllers M7, M8, and M9 are provided which control the flow amount of the carrier gas introduced into the first, second, and third organic metal storage containers 55, 56, and 57.

The first gas supply path 31 is connected to the first, second, and third organic metal storage containers 55, 56, and 57 by the first connections 85a, 86a, and 87a. The first connections 85a, 86a, and 87a are, for example, four-way valves, and control the flow state and the interruption state of the organic metal with respect to the first gas supply path 31. In the case where the four-way valve is opened, the organic metal is supplied to the first gas supply path 31, and in the case where the four-way valve is closed, the organic metal is not supplied to the first gas supply path 31.

The first gas supply path 31 is connected to the carrier gas supply source 11 which supplies the carrier gas.

Further, the first gas discharge path 54 is provided. The first gas discharge path 54 is provided so as to discharge the first process gas to the outside of the apparatus when the vapor phase growth apparatus does not perform the film formation process.

The first gas discharge path 54 is connected to the first, second, and third organic metal storage containers 55, 56, and 57 by the second connections 85b, 86b, and 87b. The second connections 85b, 86b, and 87b are, for example, three-way valves, and control the flow state and the interruption state of the organic metal with respect to the first gas discharge path 54. In the case where the three-way valve is opened, the organic metal is supplied to the first gas discharge path 54, and in the case where the three-way valve is closed, the organic metal is not supplied to the first gas discharge path 54. The first gas discharge path 54 is connected to the path 59 through which a gas is discharged from the reaction chamber.

The first gas supply path 31 includes the mass flow controller M1 (the first mass flow controller) at the side of the carrier gas supply source 11 in relation to the first connections 85a, 86a, and 87a.

The first adjustment device 91 is provided at the side of the reaction chamber 10 in relation to the first connections 85a, 86a, and 87a of the first gas supply path 31. Further, the second adjustment device 92 is provided at the side of the second connections 85b, 86b, and 87b of the first gas discharge path 54.

Then, the first adjustment device 91 is a back pressure regulator, and the second adjustment device 92 is a mass flow controller. The back pressure regulator has a function of maintaining the pressure at the primary side, that is, the pressure at the upstream side of the back pressure regulator at a uniform value.

A configuration may be employed in which the first adjustment device 91 is configured as a mass flow controller and the second adjustment device 92 is configured as a back pressure regulator. However, since a high-temperature portion exists in the flow amount sensor unit of the mass flow controller, it is desirable that the first adjustment device 91 be a back pressure regulator and the second adjustment device 92 be a mass flow controller from the viewpoint of preventing the organic metal supplied to the reaction chamber 10 from being decomposed at the high-temperature portion.

Then, a shortcut path 58 is provided so as to cause the first gas supply path 31 between the mass flow controller M1 (the first mass flow controller) and a first adjustment device 91 to connect with the first gas discharge path 54 at the opposite side to the outside of the apparatus in relation to a second adjustment device 92. The shortcut path 58 is connected to the first gas discharge path 54 at the upstream side of a second connection 85b.

The second gas supply path 32 supplies the second process gas including the ammonia ($NH_3$) to the reaction chamber. The second process gas is the source gases of a V-group element and nitrogen (N) when the films of semiconductors of III to V groups are formed on the wafer. The second gas supply path 32 is connected to the carrier gas supply source 11. The second gas supply path 32 includes the mass flow controller M3 which controls the flow amount of the carrier gas supplied to the second gas supply path 32.

Further, the second gas discharge path 64 is provided. The second gas discharge path 64 is provided so as to discharge the second process gas to the outside of the apparatus. The second gas discharge path 64 is connected to the carrier gas supply source 11. The second gas discharge path 64 includes the mass flow controller M4 which controls the flow amount of the carrier gas supplied to the second gas discharge path 64. The second gas discharge path 64 is connected to the path 59 through which a gas is discharged from the reaction chamber.

Then, the mass flow controller M6 is provided which controls the flow amount of the ammonia introduced into the second gas supply path 32 and the second gas discharge path 64.

Further, the third gas supply path 33 is provided which supplies the third process gas to the reaction chamber 10. The third process gas is a so-called separation gas, and is ejected between the first process gas and the second process gas when both process gases are ejected into the reaction chamber 10. Accordingly, the reaction between the first process gas and the second process gas immediately after the ejection thereof is suppressed.

In the embodiment, the third gas supply path 33 is connected to the carrier gas supply source 11. Then, the hydrogen gas as the separation gas is supplied from the carrier gas supply source 11. The third gas supply path 33 is equipped with the mass flow controller M5 which controls the flow amount of the hydrogen gas supplied to the third gas supply path 33.

Figure 2:
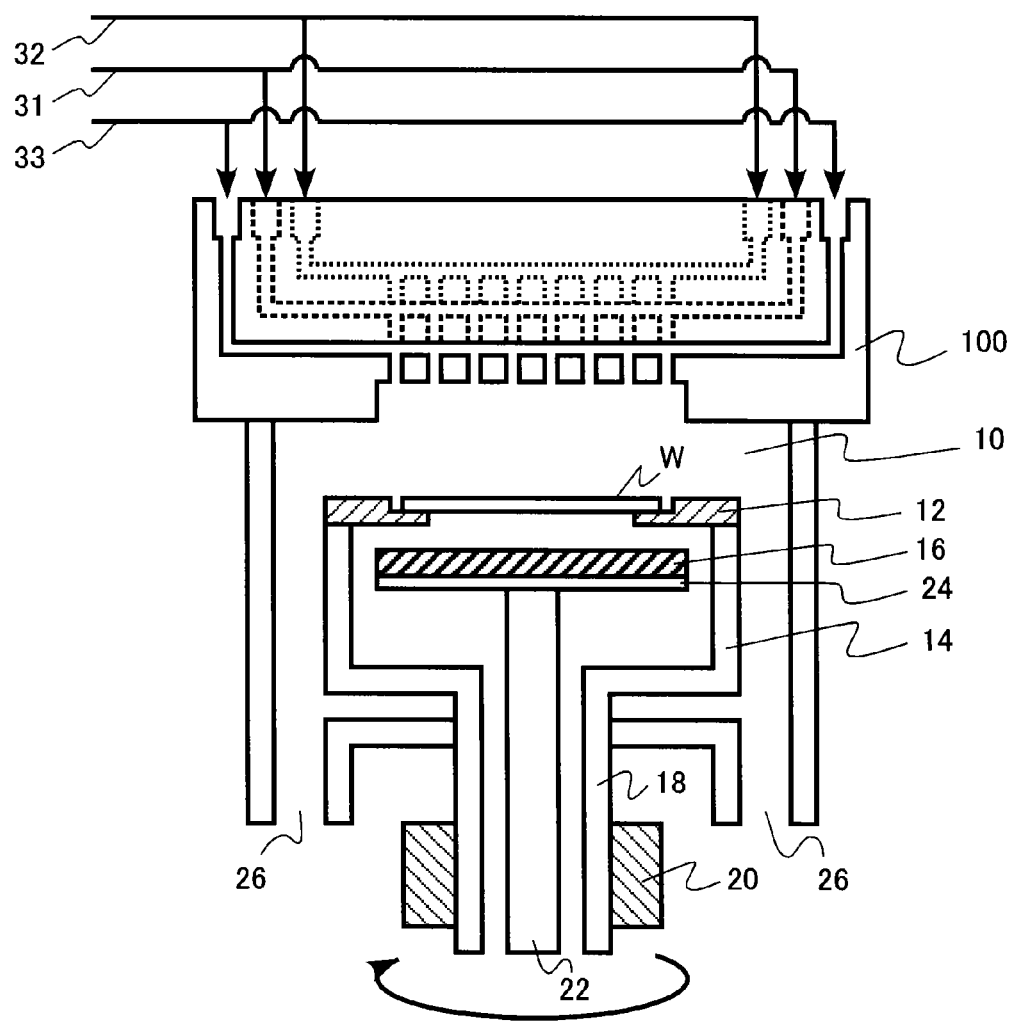
FIG. 2 is a schematic cross-sectional view of a main part of the vapor phase growth apparatus of the first embodiment.

FIG. 2 is a schematic cross-sectional view illustrating a main part of the vapor phase growth apparatus of the embodiment.

As illustrated in FIG. 2, the epitaxial growth apparatus of the embodiment includes a cylindrical hollow reaction chamber 10 which is formed of, for example, stainless. Then, the epitaxial growth apparatus includes a shower plate 100 that is disposed in the upper portion of the reaction chamber 10 and supplies a process gas into the reaction chamber 10.

Further, the epitaxial growth apparatus of the embodiment includes a support portion 12 which is provided below the shower plate 100 inside the reaction chamber 10 so as to place the semiconductor wafer (the substrate) W thereon. The support portion 12 is, for example, an annular holder that has an opening formed at the center portion or a susceptor contacting the substantially entire rear surface of the semiconductor wafer W.

First, second, and third gas supply paths 31, 32, and 33 are connected to the shower plate 100. A plurality of gas ejection holes are formed at the side of the reaction chamber 10 in the shower plate 100 so as to eject the first, second, and third process gases supplied from the first, second, and third gas supply paths 31, 32, and 33 to the reaction chamber 10.

Further, a rotation unit 14 which rotates while disposing the support portion 12 on the upper surface thereof and a heater which serves as a heating unit 16 heating the wafer W placed on the support portion 12 are provided below the support portion 12. Here, a rotation shaft 18 of the rotation unit 14 is connected to a rotational driving mechanism 20 at the lower position thereof. Then, the semiconductor wafer W may be rotated at, for example, 50 rpm to 3000 rpm by the rotational driving mechanism 20 by using the center thereof as the rotation center.

It is desirable that the diameter of the cylindrical rotation unit 14 be substantially equal to the outer peripheral diameter of the support portion 12. Furthermore, the rotation shaft 18 is rotatably provided at the bottom portion of the reaction chamber 10 through a vacuum seal member.

Then, the heating unit 16 is provided while being fixed onto a support base 24 fixed to a support shaft 22 penetrating the inside of the rotation shaft 18. Electric power is supplied to the heating unit 16 by a current introduction terminal and an electrode (not illustrated). The support base 24 is provided with, for example, a push-up pin (not illustrated) that is used to attach or detach the semiconductor wafer W to or from the annular holder.

Further, the bottom portion of the reaction chamber 10 is provided with a gas discharge portion 26 that discharges a reaction product obtained by the reaction of a source gas on the surface of the semiconductor wafer W and a residual gas of the reaction chamber 10 to the outside of the reaction chamber 10. Furthermore, the gas discharge portion 26 is connected to a vacuum pump (not illustrated). The gas discharge portion 26 is connected to a path 59 to which the first gas discharge path 54 and the second gas discharge path 64 are connected (FIG. 1).

Furthermore, in the single wafer type epitaxial growth apparatus illustrated in FIG. 2, a wafer exit/entrance and a gate valve (not illustrated) through which the semiconductor wafer W is inserted and extracted are provided at the side wall position of the reaction chamber 10. Then, the semiconductor wafer W may be carried by a handling arm between, for example, a load lock chamber (not illustrated) connected to the gate valve and the reaction chamber 10. Here, for example, the handling arm formed of synthetic quart may be inserted into the space between the shower plate 100 and the wafer support portion 12.

The vapor phase growth apparatus of the embodiment causes the upstream side of the first adjustment device 91 of the first gas supply path 31 to connect with the upstream side of the second adjustment device 92 of the first gas discharge path 54 by the shortcut path 58. Then, in the communication state, the pressure at the upstream side of the first adjustment device 91 of the first gas supply path 31 and the pressure at the upstream side of the second adjustment device 92 of the first gas discharge path 54 are substantially maintained at a predetermined uniform pressure by the back pressure regulator. The organic metal container is connected to any one of the upstream side 31a of the first adjustment device 91 of the first gas supply path 31 and the upstream side 54a of the second adjustment device 92 of the first gas discharge path 54 through any one of the first connection and the second connection. Accordingly, the bubbling pressure generated when the organic metal is bubbled may be maintained in a substantially uniform value even at the time at which the film formation process is performed or not performed. Further, even when the source gas of a group III is switched from the upstream side 54a of the second adjustment device 92 of the first gas discharge path 54 to the upstream side 31a of the first adjustment device 91 of the first gas supply path 31, the flow amount of the gas flowing through the shortcut path 58 by that amount, and the flow amount of the gas flowing through the first gas supply path 31 and the first gas discharge path 54 substantially does not change. For that reason, in the case where the source gas of a group III is switched, there is no need to cause a so-called compensation gas to flow into the passage opposite to the passage of the source gas of a group III by the gas flow amount substantially equal to the flow amount of the source gas. Accordingly, the amount of the organic metal in the source gas (the first process gas) of a group III is stabilized, and hence a process of forming a semiconductor film having a stabilized film quality may be realized.

Then, the flow amount of the source gas (the first process gas) of a group III supplied from the first gas supply path 31 to the reaction chamber 10 is controlled by a difference between the carrier gas flow amount controlled by the mass flow controllers M1, M7, M8, and M9 and the gas flow amount controlled by the second adjustment device 92 as the mass flow controller so that the source gas flow amount is maintained at a substantially uniform value. The gas flow amount controlled by the second adjustment device 92 as the mass flow controller is controlled at a value smaller than the sum of the carrier gas flow amount controlled by the upstream mass flow controllers M1, M7, M8, and M9. Accordingly, the supply of the source gas of a group III (the first process gas) with respect to the reaction chamber 10 is maintained.

Particularly, even when multiple organic metal supply sources exist as in the embodiment, it is possible to stabilize the bubbling pressure of the organic metal and the flow amount of the source gas of a group III supplied to the reaction chamber 10 by a simple configuration in which one back pressure regulator and one mass flow controller are provided in the first gas supply path 31 and the first gas discharge path 54.

According to the vapor phase growth apparatus of the embodiment, it is possible to provide the vapor phase growth apparatus that stabilizes the amount of the organic metal in the source gas of a group III by a simple configuration.

The vapor phase growth method of the embodiment uses the single wafer type epitaxial growth apparatus of FIGS. 1 and 2. Then, the substrate is carried into the reaction chamber, the carrier gas is caused to flow into the gas supply path and the gas discharge path, the organic metal is caused to flow into the gas discharge path while the flowing of the organic metal into the gas supply path is interrupted, the gas supply path and the gas discharge path connected with each other by the shortcut path so that the pressure inside the gas supply path becomes substantially equal to the pressure inside the gas discharge path, the pressure is controlled at a desired pressure by the back pressure regulator, the flowing of the organic metal into the gas discharge path is interrupted, the organic metal is caused to flow into the gas supply path, and the organic metal and the carrier gas are supplied to the reaction chamber while the pressure is maintained at a desired pressure so as to form a semiconductor film on the surface of the substrate.

Hereinafter, the vapor phase growth method of the embodiment will be described by exemplifying a case where the epitaxial growth of GaN is performed.

In a state where the reaction chamber 10 is controlled at a predetermined pressure by supplying a carrier gas to the reaction chamber 10 and discharging the gas inside the reaction chamber 10 from the gas discharge portion 26 by the operation of a vacuum pump (not illustrated), the semiconductor wafer W is placed on the support portion 12 inside the reaction chamber 10. Here, for example, the gate valve (not illustrated) of the wafer exit/entrance of the reaction chamber 10 is opened, and the semiconductor wafer W inside the load lock chamber is carried into the reaction chamber 10 by the handling arm. Then, the semiconductor wafer W is placed on the support portion 12 through, for example, the push-up pin (not illustrated), the handling arm is returned to the load lock chamber, and the gate valve is closed.

Here, the semiconductor wafer W placed on the support portion 12 is pre-heated to a predetermined temperature by the heating unit 16.

The hydrogen gas flows from the carrier gas supply source 11 into the first gas supply path 31 and the first gas discharge path 54. The flow amount of the hydrogen gas flowing into the first gas supply path 31 is controlled by the difference between the carrier gas flow amount controlled by the mass flow controllers M1, M7, M8, and M9 and the gas flow amount controlled by the second adjustment device 92 as a mass flow controller. Further, the flow amount of the hydrogen gas flowing into the first gas discharge path 54 is controlled by the second adjustment device 92 as a mass flow controller. For that reason, the gas flow amount controlled by the second adjustment device 92 as a mass flow controller becomes a value smaller than the sum of the carrier gas flow amount controlled by the upstream mass flow controllers M1, M7, M8, and M9.

Further, the hydrogen gas is supplied from the carrier gas supply source 11 to the first organic metal storage container 55 storing the TMG so as to bubble the TMG. The flow amount of the hydrogen gas supplied to the first organic metal storage container 55 is controlled by the mass flow controller M7.

At the stage before the film formation process, TMG flows into the first gas discharge path 54 while the flowing of bubbled organic metal into the first gas supply path 31 is interrupted. At this time, the upstream side of the first adjustment device 91 of the first gas supply path 31 communicates with the upstream side of the second adjustment device 92 of the first gas discharge path 54 through the shortcut path 58 by opening the control valve 93. Accordingly, the pressure of the upstream side of the first adjustment device 91 of the first gas supply path 31 and the pressure of the upstream side of the second adjustment device 92 of the first gas discharge path 54 become substantially equal to each other. Further, the pressure at the upstream side of the first adjustment device 91 of the first gas supply path 31 and the pressure of the upstream side of the second adjustment device 92 of the first gas discharge path 54 are controlled at a desired pressure by the first adjustment device 91 as a back pressure regulator.

Here, the hydrogen gas is supplied from the first gas supply path 31 to the reaction chamber 10.

The flow amount of the hydrogen gas supplied from the first gas supply path 31 to the reaction chamber is controlled by the difference between the carrier gas flow amount controlled by the upstream mass flow controllers M1, M7, M8, and M9 and the gas flow amount controlled by the second adjustment device 92 as a mass flow controller. For that reason, the gas flow amount controlled by the second adjustment device 92 as a mass flow controller becomes a value smaller than the sum of the carrier gas flow amount controlled by the upstream mass flow controllers M1, M7, M8, and M9. Accordingly, the supply of the carrier gas (the hydrogen gas) with respect to the reaction chamber 10 is maintained.

The source gas (the first process gas) including the TMG and the hydrogen gas not supplied to the reaction chamber 10 is discharged by the first gas discharge path 54.

Further, the hydrogen gas flows from the carrier gas supply source 11 into the second gas supply path 32 and the second gas discharge path 64. The flow amount of the hydrogen gas flowing into the second gas supply path 32 is controlled by the mass flow controller M3. Further, the flow amount of the hydrogen gas flowing into the second gas discharge path 64 is controlled by the mass flow controller M4.

At the stage before the film formation process, the ammonia (the second process gas) flows into the second gas discharge path 64. At this time, the flowing of the ammonia into the second gas supply path 32 is interrupted. The ammonia is discharged from the second gas discharge path 64.

Meanwhile, the hydrogen gas is supplied to the reaction chamber 10 through the second gas supply path 32.

Further, the hydrogen gas flows from the carrier gas supply source 11 into the third gas supply path 33. This hydrogen gas is supplied to the reaction chamber 10. The flow amount of the hydrogen gas flowing into the third gas supply path 33 is controlled by the mass flow controller M5.

Subsequently, the heating output of the heating unit 16 is increased so that the temperature of the semiconductor wafer W is increased to a predetermined temperature, for example, a baking temperature of about 1150° C.

Then, the evacuation is performed by the vacuum pump and the baking process is performed before the film formation process while the rotation unit 14 is rotated at a predetermined speed. By this baking process, for example, the natural oxide film on the semiconductor wafer W is removed.

During the baking process, the hydrogen gas is supplied to the reaction chamber 10 through the first gas supply path 31, the second gas supply path 32, and the third gas supply path 33.

After a baking process is performed for a predetermined time, for example, the heating output of the heating unit 16 is decreased so that the temperature of the semiconductor wafer W drops to the epitaxial growth temperature, for example, 1100° C.

Here, when the second connection 85b is closed and the first connection 85a is opened, the TMG (the first process gas) using the hydrogen gas as the carrier gas is supplied from the first gas supply path 31 to the reaction chamber 10 through the shower plate 100. Further, when the connection 89b is closed and the connection 89a is opened, the ammonia (the second process gas) is supplied from the second gas supply path 32 to the reaction chamber 10 through the shower plate 100. Further, the hydrogen gas (the third process gas) is supplied from the third gas supply path 33 to the reaction chamber 10 through the shower plate 100. Accordingly, the epitaxial growth of the GaN film is performed on the semiconductor wafer W.

In the case where the source gas (the first process gas) of a group III including TMG flows from the first gas supply path 31 into the reaction chamber 10, the flowing of the source gas of a group III into the first gas discharge path 54 is interrupted by closing the second connection 85b. Then, the source gas of a group III is caused to flow into the first gas supply path 31 by opening the first connection 85a. Then, TMG using the hydrogen gas as the carrier gas is supplied to the reaction chamber 10 while the pressure inside the first gas supply path 31 and the first gas discharge path 54 is maintained at a desired pressure. The hydrogen gas is discharged while flowing through the first gas discharge path 54.

In the case where the supply target of TMG is switched from the first gas discharge path 54 to the first gas supply path 31, the pressure at the upstream side of the first adjustment device 91 of the first gas supply path 31 and the pressure at the upstream side of the second adjustment device 92 of the first gas discharge path 54 are maintained so as to be substantially equal to each other. Accordingly, since the bubbling pressure of TMG is maintained at the uniform value before and after the switching, the amount of TMG in the source gas (the first process gas) of a group III is stabilized without a large change.

In the case where the ammonia (the second process gas) is caused to flow from the second gas supply path 32 into the reaction chamber 10, the flowing of the ammonia into the second gas discharge path 64 is interrupted, the ammonia is caused to flow into the second gas supply path 32, and the ammonia is supplied to the reaction chamber 10. The hydrogen gas is discharged while flowing through the second gas discharge path 64.

Then, in the case where the epitaxial growth ends, the flowing of the source gas of a group III into the first gas supply path 31 is interrupted by closing the first connection 85a. Then, the source gas of a group III is caused to flow into the first gas discharge path 54 by opening the second connection 85b, and then the growth of the single-crystal film of GaN ends. After the temperature of the semiconductor wafer W decreases to a predetermined temperature in a manner such that the heating output of the heating unit 16 is decreased so as to decrease the temperature of the semiconductor wafer W, the supply of the ammonia from the second gas supply path 32 to the reaction chamber 10 is stopped by closing the connection 89b and opening the connection 89a.

In the case where the film formation process ends, the flowing of TMG into the first gas supply path 31 is interrupted, and the flowing thereof is switched so that the TMG flows through the first gas discharge path 54. Then, the hydrogen gas is supplied to the reaction chamber 10 through the first gas supply path 31.

Further, the flowing of the ammonia into the second gas supply path 32 is interrupted, and the flowing of the ammonia is switched so that the ammonia flows through the second gas discharge path 64. Then, the hydrogen gas is supplied to the reaction chamber 10 through the second gas supply path 32.

Here, for example, the rotation of the rotation unit 14 is stopped, and the heating output of the heating unit 16 is returned to the first state so as to decrease the temperature to the pre-heating temperature while the semiconductor wafer W having the single-crystal film formed thereon is placed on the support portion 12.

Next, the semiconductor wafer W is detachably attached to the support portion 12 by, for example, the push-up pin. Then, the gate valve is opened again, the handling arm is inserted between the shower plate 100 and the support portion 12, and the semiconductor wafer W is placed thereon. Then, the handling arm that loads the semiconductor wafer W thereon is returned to the load lock chamber.

As described above, each film formation process for the semiconductor wafer W ends. In succession, for example, the film formation process on the other semiconductor wafer W may be performed according to the same process sequence as the above-described one.

In the vapor phase growth method of the embodiment, the pressure at the upstream side of the first adjustment device 91 of the first gas supply path 31 and the pressure at the upstream side of the second adjustment device 92 of the first gas discharge path 54 are maintained at a substantially uniform value in the case where the flowing of the organic metal is switched from the first gas discharge path 54 to the first gas supply path 31. Further, the flow amount of the first process gas including organic metal supplied to the reaction chamber 10 is maintained at a desired flow amount by the first mass flow controller M1, the first adjustment device 91, and the second adjustment device 92. Accordingly, the amount of the organic metal in the first process gas is stabilized, and the flow amount of the first process gas is also stabilized. Accordingly, a uniform single-crystal semiconductor film may be formed on the surface of the semiconductor wafer W.

Furthermore, in the embodiment, the flow amount of the source gas (the first process gas) of a group III and the carrier gas (the hydrogen gas) supplied from the first gas supply path 31 to the reaction chamber 10 before and after the film formation process is controlled by the difference between the carrier gas flow amount controlled by the mass flow controllers M1, M7, M8, and M9 and the gas flow amount controlled by the second adjustment device 92 as a mass flow controller so that the flow amount of the source gas is maintained at a substantially uniform value. The flow amount of the second adjustment device 92 is controlled at a value smaller than the flow amount of the mass flow controller M1 and larger than the sum of the flow amount of the mass flow controllers M7, M8, and M9. Accordingly, the supply of the carrier gas (the hydrogen gas) and the source gas (the first process gas) of a group III with respect to the reaction chamber 10 are maintained. When the flow amount of the second adjustment device 92 is larger than the flow amount of the mass flow controller M1, a gas of a deficient amount, that is, a part of a gas of a group III flowing to the upstream side 31a of the first adjustment device 91 of the first gas supply path 31 flows to the first gas discharge path 54 through the shortcut path 58. Further, when the flow amount of the second adjustment device 92 is smaller than the sum of the flow amount of the mass flow controllers M7, M8, and M9, a part of a gas flowing to the upstream side 54a of the second adjustment device 92 of the first gas discharge path 54 flows to the first gas supply path 31 through the shortcut path 58.

Second Embodiment

A vapor phase growth apparatus of the embodiment includes: a reaction chamber; a gas supply path connected to an organic metal supply source supplying organic metal at a first connection, the gas supply path being connected to a carrier gas supply source supplying a carrier gas, the gas supply path configured to supply a process gas including the organic metal and the carrier gas to the reaction chamber; a gas discharge path connected to the organic metal supply source at a second connection, the gas discharge path configured to discharge the process gas including the organic metal and the carrier gas to an outside of the apparatus; a first mass flow controller provided at the gas supply path, the first mass flow controller being provided at the side of the carrier gas supply source in relation to the first connection; a second mass flow controller provided at the gas discharge path, the second mass flow controller being provided at a side of the carrier gas supply source in relation to the second connection, the gas discharge path is connected to the carrier gas supply source; a first adjustment device provided at the gas supply path, the first adjustment device being provided at a side of the reaction chamber in relation to the first connection; a second adjustment device provided at the gas discharge path, the second adjustment device being provided at an outside of the apparatus in relation to the second connection; and a shortcut path connecting the gas supply path and the gas discharge path, one end of the shortcut path is connected to the gas supply path between the first mass flow controller and the first adjustment device, and other end of the shortcut path being connected to the gas discharge path between the second mass flow controller and the second adjustment device. Then, any one of the first adjustment device and the second adjustment device is the back pressure regulator, and the other thereof is the mass flow controller. The gas discharge path is connected to the carrier gas supply source. Then, any one of the first adjustment device and the second adjustment device is the back pressure regulator, and the other thereof is the mass flow controller.

Since the vapor phase growth apparatus of the embodiment has the above-described configuration, the pressure between the gas discharge path and the gas supply path through which the organic metal flows may be maintained at a desired value, that is, the same pressure by a simple configuration. Accordingly, the amount of the organic metal in the process gas (the source gas) including the organic metal supplied from the gas supply path to the reaction chamber is stabilized during the film formation process. Accordingly, a process of forming a film having stabilized film quality may be realized.

Figure 3:
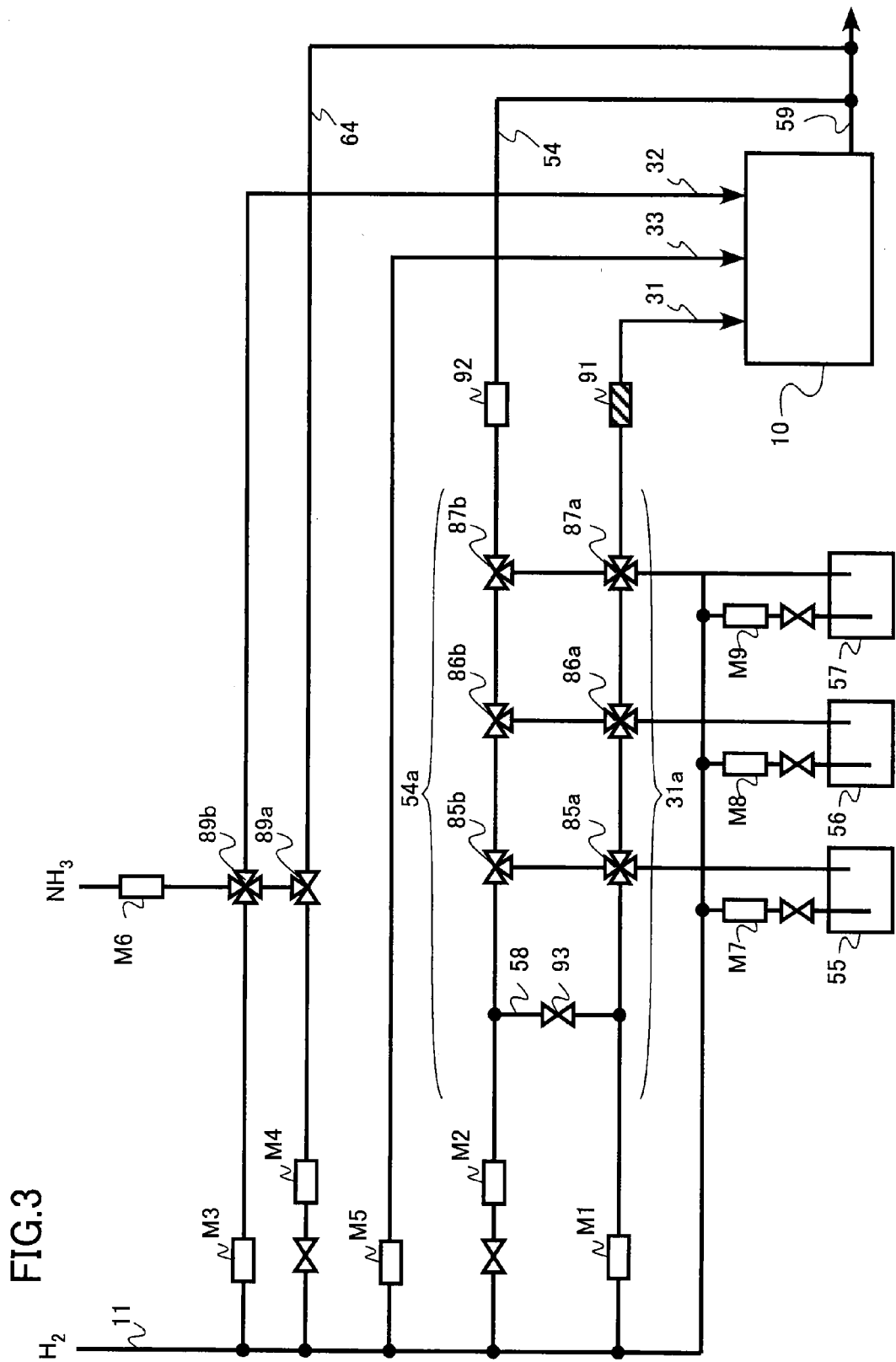
FIG. 3 is a configuration diagram of a vapor phase growth apparatus of a second embodiment.

FIG. 3 is a configuration diagram of the vapor phase growth apparatus of the embodiment. The vapor phase growth apparatus of the embodiment is a vertical single wafer type epitaxial growth apparatus that uses MOCVD (metal organic chemical vapor deposition). Hereinafter, a case will be mainly described in which the epitaxial growth of GaN (gallium nitride) is performed.

The vapor phase growth apparatus includes the reaction chamber 10 in which a film is formed on a substrate such as a wafer. Then, the first gas supply path 31, the second gas supply path 32, and the third gas supply path 33 are provided which supply the process gases to the reaction chamber.

The first gas supply path 31 supplies the first process gas including the carrier gas and the organic metal of the group-III element to the reaction chamber. The first process gas is a gas including a group-III element when the films of semiconductors of groups III to V are formed on the wafer.

The group-III element is, for example, gallium (Ga), Al (aluminum), In (indium), or the like. Further, the organic metal is trimethylgallium (TMG), trimethylaluminum (TMA), trimethylindium (TMI), or the like.

Further, the first, second, and third organic metal storage containers 55, 56, and 57 storing the organic metal are provided. The first, second, and third organic metal storage containers 55, 56, and 57 are examples of the organic metal supply source. The first organic metal storage container 55 stores, for example, TMG, the second organic metal storage container 56 stores, for example, TMA, and the third organic metal storage container 57 stores, for example, TMI.

Further, the first, second, and third organic metal storage containers 55, 56, and 57 are connected to the carrier gas supply source 11 into which the carrier gas used to bubble the organic metal is introduced. The carrier gas supply source 11 is, for example, a hydrogen gas line which supplies the hydrogen gas. Further, the mass flow controllers M7, M8, and M9 are provided which control the flow amount of the carrier gas introduced into the first, second, and third organic metal storage containers 55, 56, and 57.

The first gas supply path 31 is connected to the first, second, and third organic metal storage containers 55, 56, and 57 by the first connections 85a, 86a, and 87a. The first connections 85a, 86a, and 87a are, for example, four-way valves, and control the flow state and the interruption state of the organic metal with respect to the first gas supply path 31. In the case where the four-way valve is opened, the organic metal is supplied to the first gas supply path 31, and in the case where the four-way valve is closed, the organic metal is not supplied to the first gas supply path 31.

The first gas supply path 31 is connected to the carrier gas supply source 11 which supplies the carrier gas.

Further, the first gas discharge path 54 is provided. The first gas discharge path 54 is provided so as to discharge the first process gas to the outside of the apparatus when the vapor phase growth apparatus does not perform the film formation process.

The first gas discharge path 54 is connected to the first, second, and third organic metal storage containers 55, 56, and 57 by the second connections 85b, 86b, and 87b. The second connections 85b, 86b, and 87b are, for example, three-way valves, and control the flow state and the interruption state of the organic metal with respect to the first gas discharge path 54. In the case where the three-way valve is opened, the organic metal is supplied to the first gas discharge path 54, and in the case where the three-way valve is closed, the organic metal is not supplied to the first gas discharge path 54. The first gas discharge path 54 is connected to the path 59 through which a gas is discharged from the reaction chamber.

The first gas supply path 31 includes the mass flow controller M1 (the first mass flow controller) at the side of the carrier gas supply source 11 in relation to the first connections 85a, 86a, and 87a.

The first gas discharge path 54 includes the mass flow controller M2 (the second mass flow controller) which is provided at the side of the carrier gas supply source 11 in relation to the second connections 85b, 86b, and 87b.

The first adjustment device 91 is provided at the side of the reaction chamber 10 in relation to the first connections 85a, 86a, and 87a of the first gas supply path 31. Further, the second adjustment device 92 is provided at the side of the second connections 85b, 86b, and 87b of the first gas discharge path 54.

Then, the first adjustment device 91 is a back pressure regulator, and the second adjustment device 92 is a mass flow controller. The back pressure regulator has a function of maintaining the pressure at the primary side, that is, the pressure at the upstream side of the back pressure regulator at a uniform value.

A configuration may be employed in which the first adjustment device 91 is configured as a mass flow controller and the second adjustment device 92 is configured as a back pressure regulator. However, since a high-temperature portion exists in the flow amount sensor unit of the mass flow controller, it is desirable that the first adjustment device 91 be a back pressure regulator and the second adjustment device 92 be a mass flow controller from the viewpoint of preventing the organic metal supplied to the reaction chamber 10 from being decomposed at the high-temperature portion.

Then, a shortcut path 58 is provided so as to cause a part between the mass flow controller M1 (the first mass flow controller) and the first adjustment device 91 to connect with a part between the mass flow controller M2 (the second mass flow controller) and the second adjustment device 92.

It is desirable to install the shortcut path 58 so that the shortcut path causes a part between the mass flow controller M1 (the first mass flow controller) and the first connection 85a to connect with a part between the mass flow controller M2 (the second mass flow controller) and the second connection 85b. This is because a change in the amount of the organic metal in the gas is suppressed by the gas including organic metal and moving between the first gas supply path 31 and the first gas discharge path 54.

Further, it is desirable to provide a control valve 93 which controls the gas passage/interruption state in the shortcut path 58. This is because the first gas supply path 31 and the first gas discharge path 54 may be interrupted from each other during, for example, the maintenance of the apparatus.

The second gas supply path 32 supplies the second process gas including the ammonia ($NH_3$) to the reaction chamber. The second process gas is the source gases of a V-group element and nitrogen (N) when the films of semiconductors of III to V groups are formed on the wafer. The second gas supply path 32 is connected to the carrier gas supply source 11. The second gas supply path 32 includes the mass flow controller M3 which controls the flow amount of the carrier gas supplied to the second gas supply path 32.

Further, the second gas discharge path 64 is provided. The second gas discharge path 64 is provided so as to discharge the second process gas to the outside of the apparatus. The second gas discharge path 64 is connected to the carrier gas supply source 11. The second gas discharge path 64 includes the mass flow controller M4 which controls the flow amount of the carrier gas supplied to the second gas discharge path 64. The second gas discharge path 64 is connected to the path 59 through which a gas is discharged from the reaction chamber.

Then, the mass flow controller M6 is provided which controls the flow amount of the ammonia introduced into the second gas supply path 32 and the second gas discharge path 64.

Further, the third gas supply path 33 is provided which supplies the third process gas to the reaction chamber 10. The third process gas is a so-called separation gas, and is ejected between the first process gas and the second process gas when both process gases are ejected into the reaction chamber 10. Accordingly, the reaction between the first process gas and the second process gas immediately after the ejection thereof is suppressed.

In the embodiment, the third gas supply path 33 is connected to the carrier gas supply source 11. Then, the hydrogen gas as the separation gas is supplied from the carrier gas supply source 11. The third gas supply path 33 is equipped with the mass flow controller M5 which controls the flow amount of the hydrogen gas supplied to the third gas supply path 33.

Furthermore, since the main part of the vapor phase growth apparatus of the embodiment is the same as that of the first embodiment, the description will not be repeated.

The vapor phase growth apparatus of the embodiment causes the upstream side of the first adjustment device 91 of the first gas supply path 31 to connect with the upstream side of the second adjustment device 92 of the first gas discharge path 54 by the shortcut path 58. Then, in the communication state, the pressure at the upstream side of the first adjustment device 91 of the first gas supply path 31 and the pressure at the upstream side of the second adjustment device 92 of the first gas discharge path 54 are substantially maintained at a predetermined uniform pressure by the back pressure regulator. The organic metal container is connected to any one of the upstream side 31a of the first adjustment device 91 of the first gas supply path 31 and the upstream side 54a of the second adjustment device 92 of the first gas discharge path 54 through any one of the first connection and the second connection. Accordingly, the bubbling pressure generated when the organic metal is bubbled may be maintained in a substantially uniform value even at the time at which the film formation process is performed or not performed. Further, even when the source gas of a group III is switched from the upstream side 54a of the second adjustment device 92 of the first gas discharge path 54 to the upstream side 31a of the first adjustment device 91 of the first gas supply path 31, the flow amount of the gas flowing through the shortcut path 58 by that amount, and the flow amount of the gas flowing through the first gas supply path 31 and the first gas discharge path 54 substantially does not change. For that reason, in the case where the source gas of a group III is switched, there is no need to cause a so-called compensation gas to flow into the passage opposite to the passage of the source gas of a group III by the gas flow amount substantially equal to the flow amount of the source gas. Accordingly, the amount of the organic metal in the source gas (the first process gas) of a group III is stabilized, and hence a process of forming a semiconductor film having a stabilized film quality may be realized.

Then, the flow amount of the source gas (the first process gas) of a group III supplied from the first gas supply path 31 to the reaction chamber 10 is controlled by the difference between the carrier gas flow amount controlled by the mass flow controllers M1, M2, M7, M8, and M9 and the gas flow amount controlled by the second adjustment device 92 as a mass flow controller so that the flow amount of the source gas is maintained at a substantially uniform value. The flow amount of the second adjustment device 92 as a mass flow controller is controlled at a value smaller than the sum of the carrier gas flow amount controlled by the mass flow controllers M1, M2, M7, M8, and M9. Accordingly, the supply of the source gas of a group III (the first process gas) with respect to the reaction chamber 10 is maintained.

Particularly, even when multiple organic metal supply sources exist as in the embodiment, it is possible to stabilize the bubbling pressure of the organic metal and the flow amount of the source gas of a group III supplied to the reaction chamber 10 by a simple configuration in which one back pressure regulator and one mass flow controller are provided in the first gas supply path 31 and the first gas discharge path 54.

According to the vapor phase growth apparatus of the embodiment, it is possible to provide the vapor phase growth apparatus that stabilizes the amount of the organic metal in the source gas of a group III by a simple configuration.

The vapor phase growth method of the embodiment uses the single wafer type epitaxial growth apparatus of FIGS. 3 and 2. Then, the substrate is carried into the reaction chamber, the carrier gas is caused to flow into the gas supply path and the gas discharge path, the organic metal is caused to flow into the gas discharge path while the flowing of the organic metal into the gas supply path is interrupted, the gas supply path and the gas discharge path connected with each other by the shortcut path so that the pressure inside the gas supply path becomes substantially equal to the pressure inside the gas discharge path, the pressure is controlled at a desired pressure by the back pressure regulator, the flowing of the organic metal into the gas discharge path is interrupted, the organic metal is caused to flow into the gas supply path, and the organic metal and the carrier gas are supplied to the reaction chamber while the pressure is maintained at a desired pressure so as to form a semiconductor film on the surface of the substrate.

Hereinafter, the vapor phase growth method of the embodiment will be described by exemplifying a case where the epitaxial growth of GaN is performed.

The carrier gas is supplied to the reaction chamber 10, the vacuum pump (not illustrated) is operated so as to discharge the gas inside the reaction chamber 10 from the gas discharge portion 26, and the semiconductor wafer W is placed on the support portion 12 inside the reaction chamber 10 while the reaction chamber 10 is controlled at a predetermined pressure. Here, for example, the gate valve (not illustrated) of the wafer exit/entrance of the reaction chamber 10 is opened, and the semiconductor wafer W inside the load lock chamber is carried into the reaction chamber 10 by the handling arm. Then, the semiconductor wafer W is placed on the support portion 12 through, for example, the push-up pin (not illustrated), the handling arm is returned to the load lock chamber, and the gate valve is closed.

Here, the semiconductor wafer W placed on the support portion 12 is pre-heated to a predetermined temperature by the heating unit 16.

The hydrogen gas flows from the carrier gas supply source 11 into the first gas supply path 31 and the first gas discharge path 54. The flow amount of the hydrogen gas flowing into the first gas supply path 31 is controlled by the difference between the carrier gas flow amount controlled by the mass flow controllers M1, M2, M7, M8, and M9 and the second adjustment device 92 as a mass flow controller. Further, the flow amount of the hydrogen gas flowing into the first gas discharge path 54 is controlled by the second adjustment device 92 as a mass flow controller. For that reason, the gas flow amount controlled by the second adjustment device 92 as a mass flow controller becomes a value smaller than the sum of the carrier gas flow amount controlled by the upstream mass flow controllers M1, M2, M7, M8, and M9.

Further, the hydrogen gas is supplied from the carrier gas supply source 11 to the first organic metal storage container 55 storing the TMG so as to bubble the TMG. The flow amount of the hydrogen gas supplied to the first organic metal storage container 55 is controlled by the mass flow controller M7.

At the stage before the film formation process, TMG flows into the first gas discharge path 54 while the flowing of bubbled organic metal into the first gas supply path 31 is interrupted. At this time, the upstream side of the first adjustment device 91 of the first gas supply path 31 communicates with the upstream side of the second adjustment device 92 of the first gas discharge path 54 through the shortcut path 58 by opening the control valve 93. Accordingly, the pressure of the upstream side of the first adjustment device 91 of the first gas supply path 31 and the pressure of the upstream side of the second adjustment device 92 of the first gas discharge path 54 become substantially equal to each other. Further, the pressure at the upstream side of the first adjustment device 91 of the first gas supply path 31 and the pressure of the upstream side of the second adjustment device 92 of the first gas discharge path 54 are controlled at a desired pressure by the first adjustment device 91 as a back pressure regulator.

Here, the hydrogen gas is supplied from the first gas supply path 31 to the reaction chamber 10.

The flow amount of the hydrogen gas supplied from the first gas supply path 31 to the reaction chamber is controlled by the difference between the carrier gas flow amount controlled by the upstream mass flow controllers M1, M2, M7, M8, and M9 and the gas flow amount controlled by the second adjustment device 92 as a mass flow controller. For that reason, the flow amount of the second adjustment device 92 as a mass flow controller is controlled at a value smaller than the sum of the carrier gas flow amount controlled by the upstream mass flow controllers M1, M2, M7, M8, and M9. Accordingly, the supply of the carrier gas (the hydrogen gas) with respect to the reaction chamber 10 is maintained.

The source gas (the first process gas) including the TMG and the hydrogen gas not supplied to the reaction chamber 10 is discharged by the first gas discharge path 54.

Further, the hydrogen gas flows from the carrier gas supply source 11 into the second gas supply path 32 and the second gas discharge path 64. The flow amount of the hydrogen gas flowing into the second gas supply path 32 is controlled by the mass flow controller M3. Further, the flow amount of the hydrogen gas flowing into the second gas discharge path 64 is controlled by the mass flow controller M4.

At the stage before the film formation process, the ammonia (the second process gas) flows into the second gas discharge path 64. At this time, the flowing of the ammonia into the second gas supply path 32 is interrupted. The ammonia is discharged from the second gas discharge path 64.

Meanwhile, the hydrogen gas is supplied to the reaction chamber 10 through the second gas supply path 32.

Further, the hydrogen gas flows from the carrier gas supply source 11 into the third gas supply path 33. This hydrogen gas is supplied to the reaction chamber 10. The flow amount of the hydrogen gas flowing into the third gas supply path 33 is controlled by the mass flow controller M5.

Subsequently, the heating output of the heating unit 16 is increased so that the temperature of the semiconductor wafer W is increased to a predetermined temperature, for example, a baking temperature of about 1150° C.

Then, the evacuation is performed by the vacuum pump and the baking process is performed before the film formation process while the rotation unit 14 is rotated at a predetermined speed. By this baking process, for example, the natural oxide film on the semiconductor wafer W is removed.

During the baking process, the hydrogen gas is supplied to the reaction chamber 10 through the first gas supply path 31, the second gas supply path 32, and the third gas supply path 33.

After a baking process is performed for a predetermined time, for example, the heating output of the heating unit 16 is decreased so that the temperature of the semiconductor wafer W drops to the epitaxial growth temperature, for example, 1100° C.

Here, when the second connection 85b is closed and the first connection 85a is opened, the TMG (the first process gas) using the hydrogen gas as the carrier gas is supplied from the first gas supply path 31 to the reaction chamber 10 through the shower plate 100. Further, when the connection 89b is closed and the connection 89a is opened, the ammonia (the second process gas) is supplied from the second gas supply path 32 to the reaction chamber 10 through the shower plate 100. Further, the hydrogen gas (the third process gas) is supplied from the third gas supply path 33 to the reaction chamber 10 through the shower plate 100. Accordingly, the epitaxial growth of the GaN film is performed on the semiconductor wafer W.

In the case where the source gas (the first process gas) of a group III including TMG flows from the first gas supply path 31 into the reaction chamber 10, the flowing of the source gas of a group III into the first gas discharge path 54 is interrupted by closing the second connection 85b. Then, the source gas of a group III is caused to flow into the first gas supply path 31 by opening the first connection 85a. Then, TMG using the hydrogen gas as the carrier gas is supplied to the reaction chamber 10 while the pressure inside the first gas supply path 31 and the first gas discharge path 54 is maintained at a desired pressure. The hydrogen gas is discharged while flowing through the first gas discharge path 54.

In the case where the supply target of TMG is switched from the first gas discharge path 54 to the first gas supply path 31, the pressure at the upstream side of the first adjustment device 91 of the first gas supply path 31 and the pressure at the upstream side of the second adjustment device 92 of the first gas discharge path 54 are maintained so as to be substantially equal to each other. Accordingly, since the bubbling pressure of TMG is maintained at the uniform value before and after the switching, the amount of TMG in the source gas (the first process gas) of a group III is stabilized without a large change.

In the case where the ammonia (the second process gas) is caused to flow from the second gas supply path 32 into the reaction chamber 10, the flowing of the ammonia into the second gas discharge path 64 is interrupted, the ammonia is caused to flow into the second gas supply path 32, and the ammonia is supplied to the reaction chamber 10. The hydrogen gas is discharged while flowing through the second gas discharge path 64.

Then, in the case where the epitaxial growth ends, the flowing of the source gas of a group III into the first gas supply path 31 is interrupted by closing the first connection 85a. Then, the source gas of a group III is caused to flow into the first gas discharge path 54 by opening the second connection 85b, and then the growth of the single-crystal film of GaN ends. After the temperature of the semiconductor wafer W decreases to a predetermined temperature in a manner such that the heating output of the heating unit 16 is decreased so as to decrease the temperature of the semiconductor wafer W, the supply of the ammonia from the second gas supply path 32 to the reaction chamber 10 is stopped by closing the connection 89b and opening the connection 89a.

In the case where the film formation process ends, the flowing of TMG into the first gas supply path 31 is interrupted, and the flowing thereof is switched so that the TMG flows through the first gas discharge path 54. Then, the hydrogen gas is supplied to the reaction chamber 10 through the first gas supply path 31.

Further, the flowing of the ammonia into the second gas supply path 32 is interrupted, and the flowing of the ammonia is switched so that the ammonia flows through the second gas discharge path 64. Then, the hydrogen gas is supplied to the reaction chamber 10 through the second gas supply path 32.

Here, for example, the rotation of the rotation unit 14 is stopped, and the heating output of the heating unit 16 is returned to the first state so as to decrease the temperature to the pre-heating temperature while the semiconductor wafer W having the single-crystal film formed thereon is placed on the support portion 12.

Next, the semiconductor wafer W is detachably attached to the support portion 12 by, for example, the push-up pin. Then, the gate valve is opened again, the handling arm is inserted between the shower plate 100 and the support portion 12, and the semiconductor wafer W is placed thereon. Then, the handling arm that loads the semiconductor wafer W thereon is returned to the load lock chamber.

As described above, each film formation process for the semiconductor wafer W ends. In succession, for example, the film formation process on the other semiconductor wafer W may be performed according to the same process sequence as the above-described one.

In the vapor phase growth method of the embodiment, the pressure at the upstream side of the first adjustment device 91 of the first gas supply path 31 and the pressure at the upstream side of the second adjustment device 92 of the first gas discharge path 54 are maintained at a substantially uniform value in the case where the flowing of the organic metal is switched from the first gas discharge path 54 to the first gas supply path 31. Further, the flow amount of the first process gas including the organic metal supplied to the reaction chamber 10 is maintained at a desired flow amount by the first mass flow controller M1, the second mass flow controller M2, the first adjustment device 91, and the second adjustment device 92. Accordingly, the amount of the organic metal in the first process gas is stabilized, and the flow amount of the first process gas is also stabilized. Accordingly, a uniform single-crystal semiconductor film may be formed on the surface of the semiconductor wafer W.

Furthermore, in the embodiment, the flow amount of the source gas (the first process gas) of a group III and the carrier gas (the hydrogen gas) supplied from the first gas supply path 31 to the reaction chamber 10 before and after the film formation process is controlled by the difference between the carrier gas flow amount controlled by the mass flow controllers M1, M2, M7, M8, and M9 and the gas flow amount controlled by the second adjustment device 92 as a mass flow controller so that the flow amount of the source gas is maintained at a substantially uniform value. The flow amount of the second adjustment device 92 is controlled at a value smaller than the flow amount of the mass flow controller M1 and larger than the sum of the flow amount of the mass flow controllers M7, M8, and M9. Accordingly, the supply of the carrier gas (the hydrogen gas) and the source gas (the first process gas) of a group III with respect to the reaction chamber 10 are maintained. When the flow amount of the second adjustment device 92 is larger than the flow amount of the mass flow controller M1, a gas of a deficient amount, that is, a part of a gas of a group III flowing to the upstream side 31a of the first adjustment device 91 of the first gas supply path 31 flows to the first gas discharge path 54 through the shortcut path 58. Further, when the flow amount of the second adjustment device 92 is smaller than the sum of the flow amount of the mass flow controllers M7, M8, and M9, a part of a gas flowing to the upstream side 54a of the second adjustment device 92 of the first gas discharge path 54 flows to the first gas supply path 31 through the shortcut path 58.

Third Embodiment

The vapor phase growth apparatus of the embodiment is the same as that of the first embodiment except that the first adjustment device 91 is a mass flow controller and the second adjustment device 92 is a back pressure regulator. Accordingly, the same description as that of the first embodiment will not be repeated.

In the embodiment, since the first adjustment device 91 is the mass flow controller, the flow amount of the first process gas including the organic metal supplied to the reaction chamber 10 is directly controlled. Accordingly, the flow amount of the source gas (the first process gas) of a group III is further stabilized, and hence a process of forming a single-crystal semiconductor film having stabilized film quality may be realized.

In the embodiment, the flow amount of the source gas (the first process gas) of a group III supplied from the first gas supply path 31 to the reaction chamber 10 is controlled by the difference between the carrier gas flow amount controlled by the mass flow controllers M1, M2, M7, M8, and M9 and the gas flow amount controlled by the first adjustment device 91 as a mass flow controller so that the flow amount of the source gas is maintained at a substantially uniform value. The gas flow amount controlled by the first adjustment device 91 as a mass flow controller is controlled at a value smaller than the sum of the carrier gas flow amount controlled by the mass flow controllers M1, M7, M8, and M9.

Fourth Embodiment

Figure 4:
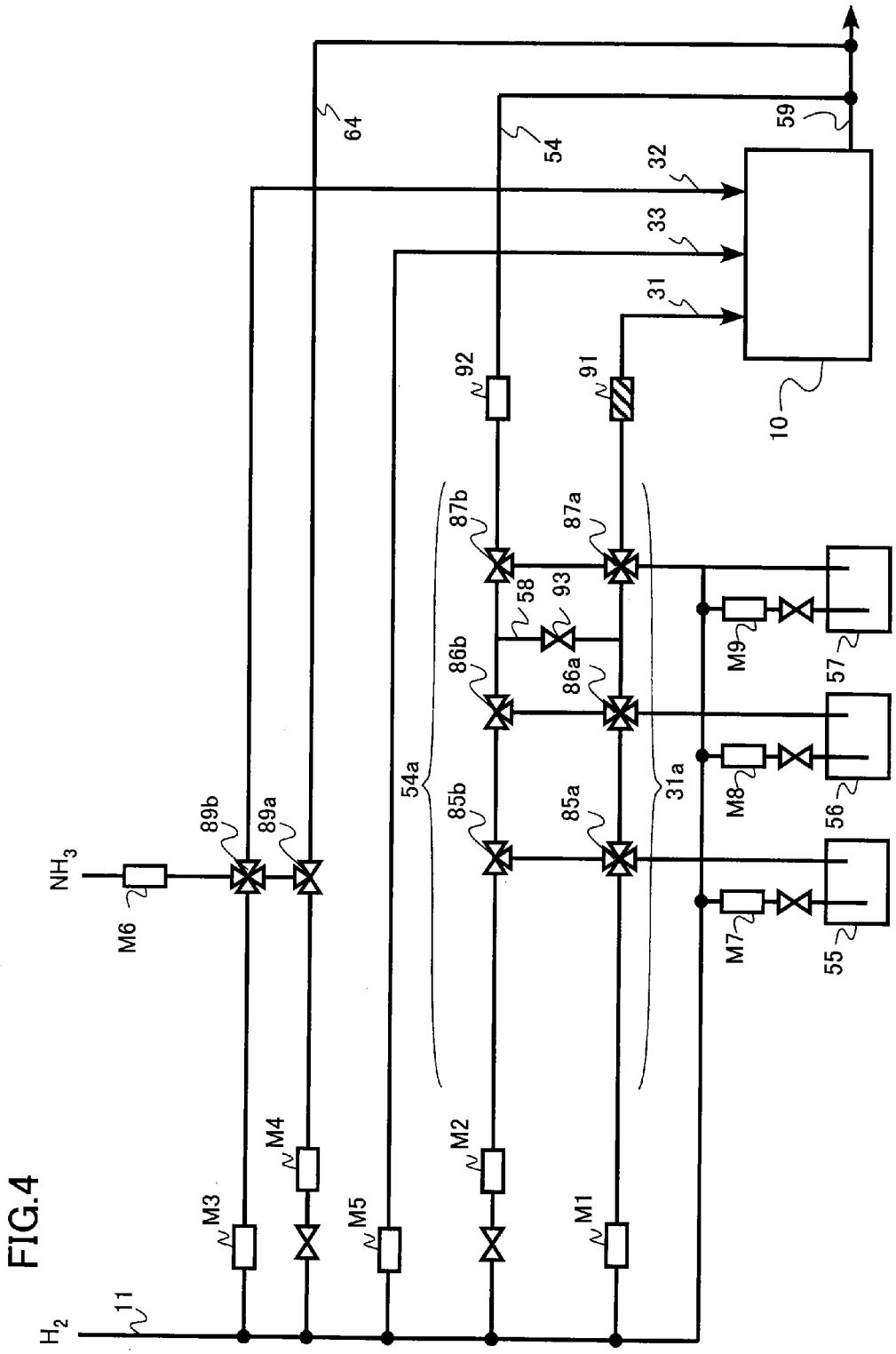
FIG. 4 is a configuration diagram of a vapor phase growth apparatus of a fourth embodiment.

The vapor phase growth apparatus of the embodiment is the same as that of the second embodiment except that the shortcut path 58 has one end of the shortcut path 58 being connected to the first gas supply path 31 between the first connection 86a and a first connection 87a, and other end of the shortcut path 58 being connected to the first gas discharge path 54 between a second connection 86b and a second connection 87b. Accordingly, the same description as that of the second embodiment will not be repeated. FIG. 4 is a configuration diagram of the vapor phase growth apparatus of the embodiment.

Even in the embodiment, the same effect as that of the second embodiment may be obtained. In the case where a semiconductor film is formed by the vapor phase growth apparatus of the embodiment, it is desirable to control the carrier gas flow amount so that the carrier gas flows through the shortcut path 58 from the first gas supply path 31 to the first gas discharge path 54 before the film formation process particularly from the viewpoint of preventing the gas including organic metal from reversely flowing from the first gas discharge path 54 to the first gas supply path 31 through the shortcut path 58. Further, it is desirable to control the carrier gas flow amount so that the carrier gas flows through the shortcut path 58 from the first gas discharge path 54 to the first gas supply path 31 in order to stabilize the amount of the organic metal supplied to the first gas supply path 31 during the film formation process.

Furthermore, the shortcut path 58 may be formed so as to cause the first gas supply path 31 between the first connection 85a and the first connection 86a to connect with the first gas discharge path 54 between the second connection 85b and the second connection 86b. Further, the shortcut path 58 may be also formed so as to cause the first gas supply path 31 between the first connection 87a and the first adjustment device 91 to connect with the first gas discharge path 54 between the second connection 87b and the second adjustment device 92.

As described above, the embodiments have been described by referring to the detailed examples. The above-described embodiments are merely examples, and do not limit the disclosure. Further, the components of the embodiments may be appropriately combined with each other.

For example, in the embodiments, a case has been described in which the single-crystal film of GaN (gallium nitride) is formed. However, the disclosure may be also applied to the case of forming single-crystal films of nitride semiconductors of the other groups III to V involving with, for example, AlN (aluminum nitride), AlGaN (aluminum gallium nitride), and InGaN (indium gallium nitride). Further, the disclosure may be also applied to semiconductors of groups III to V involving with GaAs and the like.

Further, a case has been described in which the organic metal is TMG1. However, even in the case where two kinds or more of organic metal are used as the source of the group-III element, the embodiment may stabilize the flow amount of the source gas of the group-III element toward the reaction chamber 10 and the bubbling pressure of two kinds or more of organic metal by a simple configuration. The organic metal may be an element other than the group-III element.

Further, the hydrogen gas ($H_2$) has been described as the carrier gas. However, the nitrogen gas ($N_2$), the argon gas (Ar), the helium gas (He), or the combination thereof may be applied as the carrier gas.

Further, in the embodiments, an example of the vertical single wafer type epitaxial apparatus that forms a film on each wafer has been described, but the vapor phase growth apparatus is not limited to the single wafer type epitaxial apparatus. For example, the embodiments may be also applied to a planetary CVD apparatus that simultaneously forms a film on a plurality of wafers that revolve in a spinning state.

In the embodiments, the apparatus configuration or the manufacturing method which is not directly necessary for the description of the invention is not described, but the apparatus configuration or the manufacturing method which needs to be used may be appropriately selected and used. In addition, all vapor phase growth apparatus and vapor phase growth methods that include the components of the invention and may be appropriately modified in design by the person skilled in the art are included in the scope of the invention. The scope of the invention is defined by the claims and the scope of the equivalent thereof.

What is claimed is:

1. A vapor phase growth apparatus comprising:
   a reaction chamber;
   a gas supply path connected to an organic metal supply source supplying organic metal at a first connection, the gas supply path being connected to a carrier gas supply source supplying a carrier gas, the gas supply path configured to supply a process gas including the organic metal and the carrier gas to the reaction chamber;
   a gas discharge path connected to the organic metal supply source at a second connection, the gas discharge path configured to discharge the process gas including the organic metal and the carrier gas to an outside of the apparatus;
   a first mass flow controller provided at the gas supply path, the first mass flow controller being provided at the side of the carrier gas supply source in relation to the first connection;
   a first adjustment device provided at the gas supply path, the first adjustment device being provided at a side of the reaction chamber in relation to the first connection;
   a second adjustment device provided at the gas discharge path, the second adjustment device being provided at an outside of the apparatus in relation to the second connection; and
   a shortcut path connecting the gas supply path and the gas discharge path, one end of the shortcut path being connected to the gas supply path between the first mass flow controller and the first adjustment device, other end of the shortcut path being connected to the gas discharge path opposite to an outside of the apparatus in relation to the second adjustment device,
   wherein at least one of the first adjustment device and the second adjustment device is a back pressure regulator, and the other thereof is a mass flow controller.

2. The vapor phase growth apparatus according to claim 1, further comprising a second mass flow controller provided at the gas discharge path, the second mass flow controller being provided at a side of the carrier gas supply source in relation to the second connection, wherein the gas discharge path is connected to the carrier gas supply source, and
   wherein one end of the shortcut path is connected to the gas supply path between the first mass flow controller and the first adjustment device, and other end of the shortcut path being connected to the gas discharge path between the second mass flow controller and the second adjustment device.

3. The vapor phase growth apparatus according to claim 2,
   wherein one end of the shortcut path is connected to the gas supply path between the first mass flow controller and the first connection, and other end of the shortcut path being connected to the gas discharge path between the second mass flow controller and the second connection.

4. The vapor phase growth apparatus according to claim 1,
wherein the first adjustment device is the back pressure regulator.

5. The vapor phase growth apparatus according to claim 1,
wherein the gas discharge path is connected to the organic metal supply source through the first connection, the first connection is a four-way valve, and the second connection is a three-way valve.

6. The vapor phase growth apparatus according to claim 1,
wherein the organic metal is trimethylgallium (TMG), trimethylaluminum (TMA), or trimethylindium (TMI).

7. The vapor phase growth apparatus according to claim 1,
wherein the carrier gas is a hydrogen gas.

8. A vapor phase growth method performed by using a vapor phase growth apparatus including:
a reaction chamber;
a gas supply path connected to an organic metal supply source supplying organic metal at a first connection, the gas supply path being connected to a carrier gas supply source supplying a carrier gas, the gas supply path configured to supply a process gas including the organic metal and the carrier gas to the reaction chamber;
a gas discharge path connected to the organic metal supply source at a second connection, the gas discharge path configured to discharge the process gas including the organic metal and the carrier gas to an outside of the apparatus;
a first mass flow controller provided at the gas supply path, the first mass flow controller being provided at the side of the carrier gas supply source in relation to the first connection;
a first adjustment device provided at the gas supply path, the first adjustment device being provided at a side of the reaction chamber in relation to the first connection;
a second adjustment device provided at the gas discharge path, the second adjustment device being provided at an outside of the apparatus in relation to the second connection; and
a shortcut path connecting the gas supply path and the gas discharge path, one end of the shortcut path being connected to the gas supply path between the first mass flow controller and the first adjustment device, other end of the shortcut path being connected to the gas discharge path opposite to an outside of the apparatus in relation to the second adjustment device,
wherein at least one of the first adjustment device and the second adjustment device is a back pressure regulator, and the other thereof is a mass flow controller, the vapor phase growth method comprising:
carrying in a substrate into the reaction chamber;
causing the carrier gas to flow into the gas supply path and the gas discharge path;
causing the organic metal to flow into the gas discharge path while the flow of the organic metal into the gas supply path is interrupted;
causing the gas supply path to connect with the gas discharge path by the shortcut path so that the pressure inside the gas supply path becomes substantially equal to the pressure inside the gas discharge path;
controlling the pressure at a desired pressure by the back pressure regulator;
interrupting the flow of the organic metal into the gas discharge path;
causing the organic metal to flow into the gas supply path; and
supplying the organic metal and the carrier gas to the reaction chamber while the pressure is maintained at the desired pressure so as to form a semiconductor film on a substrate surface.

9. The vapor phase growth method according to claim 8,
wherein the first adjustment device is the back pressure regulator.

10. The vapor phase growth method according to claim 8,
wherein the organic metal is trimethylgallium (TMG), trimethylaluminum (TMA), or trimethylindium (TMI).

11. The vapor phase growth method according to claim 8,
wherein the carrier gas is a hydrogen gas.

* * * * *